United States Patent
Yeon et al.

(10) Patent No.: US 12,557,594 B2
(45) Date of Patent: Feb. 17, 2026

(54) DEVICE AND METHOD FOR REAL-TIME OFFSET ADJUSTMENT OF A SEMICONDUCTOR DIE PLACEMENT

(71) Applicant: Intel Corporation, Santa Clara, CA (US)

(72) Inventors: Hong Seung Yeon, Chandler, AZ (US); Mariano Phielipp, Mesa, AZ (US); Yi Li, Chandler, AZ (US); Minglu Liu, Chandler, AZ (US); Robin McRee, Chandler, AZ (US); Yosuke Kanaoka, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 404 days.

(21) Appl. No.: 18/185,427

(22) Filed: Mar. 17, 2023

(65) Prior Publication Data

US 2024/0312819 A1 Sep. 19, 2024

(51) Int. Cl.
*H01L 21/68* (2006.01)
*H01L 21/67* (2006.01)

(52) U.S. Cl.
CPC ........ *H01L 21/68* (2013.01); *H01L 21/67259* (2013.01)

(58) Field of Classification Search
CPC .......................... H01L 21/68; H01L 21/67259
USPC .......................................................... 700/114
See application file for complete search history.

(56) References Cited

U.S. PATENT DOCUMENTS

| | | | |
|---|---|---|---|
| 2016/0148850 A1* | 5/2016 | David | G06N 7/01 355/53 |
| 2020/0006102 A1* | 1/2020 | Lin | G03F 7/70633 |
| 2020/0301404 A1* | 9/2020 | Coots | H01L 22/20 |
| 2022/0012405 A1* | 1/2022 | Oron | G06F 30/398 |
| 2023/0274987 A1* | 8/2023 | Wang | H01L 21/68707 438/5 |
| 2023/0288822 A1* | 9/2023 | Mueller | G03F 9/7003 |
| 2024/0302752 A1* | 9/2024 | Chang | G03F 7/70633 |

* cited by examiner

*Primary Examiner* — Md Azad
(74) *Attorney, Agent, or Firm* — Viering, Jentschura & Partner mbB

(57) ABSTRACT

A method for real-time offset adjustment of a semiconductor die placement comprising: obtaining or receiving operational parameters of a die mounting tool in real-time, wherein the die mounting tool is configured for placing the semiconductor die on a panel; predicting an offset adjustment of the semiconductor die placement based on the operational parameters; and determining semiconductor die placement coordinates based on an original die placement and the offset adjustment.

17 Claims, 6 Drawing Sheets

DEVICE AND METHOD FOR REAL-TIME OFFSET ADJUSTMENT OF A SEMICONDUCTOR DIE PLACEMENT

TECHNICAL FIELD

Various aspects relate to methods, devices, and non-transitory computer-readable medium and computer executable code for real-time offset adjustment of a semiconductor die placement.

BACKGROUND

In the semiconductor industry, during a packaging process, such as a semiconductor die bonding process, semiconductor dies have to be accurately placed on semiconductor panels using a die mounting tool. However, the die mounting tool may include mechanical parts which may have intrinsic variations or errors which could prevent accurate die placement on a target location on top of a panel. To compensate such variations or errors, an offset adjustment is added to the die attachment process.

A current solution to mitigate the above is to add an average offset to the die placement. This average offset is an average of the past dataset calculated by using a metrology tool. However, this methodology is not able to capture die-to-die variations because it is an average from the dataset obtained with a set of past die attachments. Additionally, the metrology tool is too slow to give an offset in real time.

Therefore, an accurate real-time offset adjustment of a semiconductor die placement is desired.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which.

DESCRIPTION

Figure 1:
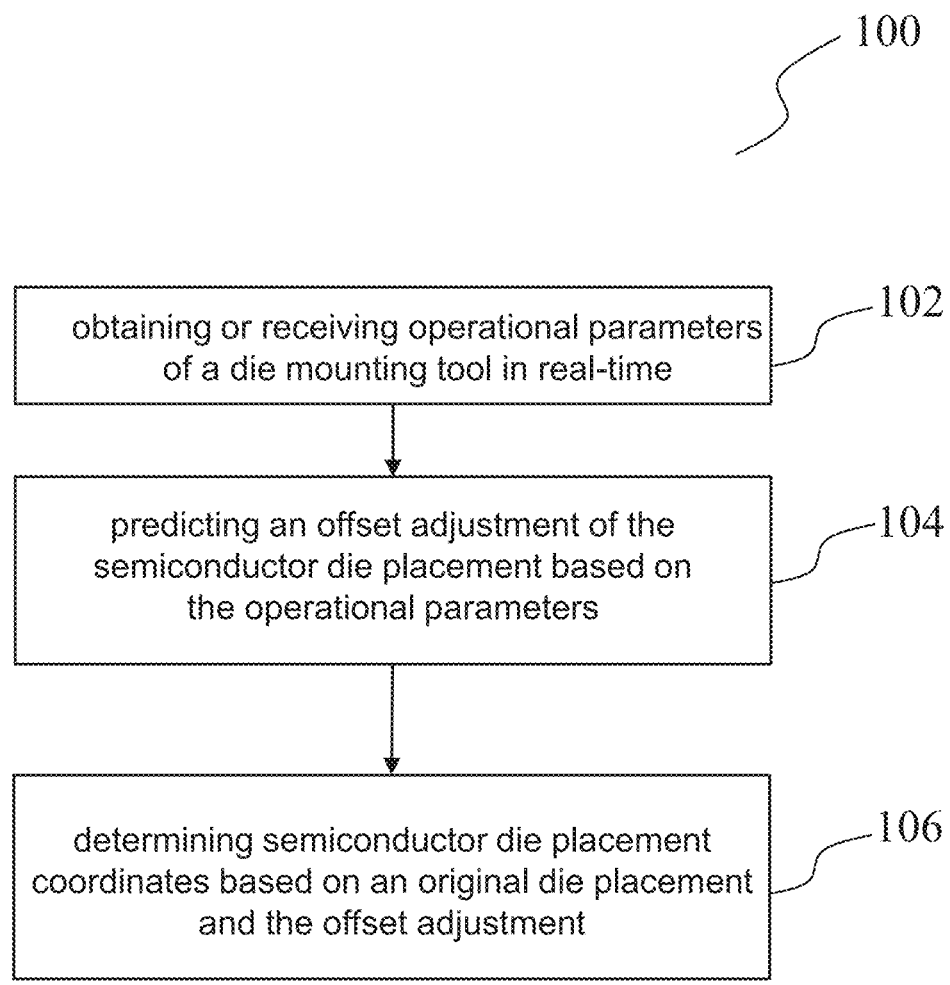
FIG. 1 shows a flow diagram of a method for real-time offset adjustment of a semiconductor die placement.

The following detailed description refers to the accompanying drawings that show, by way of illustration, specific details and aspects in which the disclosure may be practiced. One or more aspects are described in sufficient detail to enable those skilled in the art to practice the disclosure. Other aspects may be utilized and structural, logical, and/or electrical changes may be made without departing from the scope of the disclosure. The various aspects of the disclosure are not necessarily mutually exclusive, as some aspects can be combined with one or more other aspects to form new aspects or embodiments. Various aspects are described in connection with methods and various aspects are described in connection with devices. However, it may be understood that aspects described in connection with methods may similarly apply to the devices, and vice versa.

The term "exemplary" may be used herein to mean "serving as an example, instance, or illustration". Any aspect or design described herein as "exemplary" is not necessarily to be construed as preferred or advantageous over other aspects or designs.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and in the claims expressly refer to a quantity greater than one. Accordingly, any phrases explicitly invoking the aforementioned words (e.g., "a plurality of (objects)", "multiple (objects)") referring to a quantity of objects expressly refer to more than one of the said objects. The terms "group (of)", "set (of)", "collection (of)", "series (of)", "sequence (of)", "grouping (of)", etc., and the like in the description and in the claims, if any, refer to a quantity equal to or greater than one, i.e. one or more.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art. Any type of information, as described herein, may be handled for example via one or more processors in a suitable way, e.g. as data.

The terms "processor" or "controller" as, for example, used herein may be understood as any kind of entity that allows handling data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "memory" detailed herein may be understood to include any suitable type of memory or memory device, e.g., a hard disk drive (HDD), a solid-state drive (SSD), a flash memory, etc.

The term "module" detailed herein refers to, or forms part of, or includes an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

A processor, controller, and/or circuit detailed herein may be implemented in software, hardware, and/or as a hybrid implementation including software and hardware.

The term "system" (e.g., an artificial intelligence system, a machine learning system, a computing system, etc.) detailed herein may be understood as a set of interacting elements, of which the elements can be, by way of example and not of limitation, one or more mechanical components, one or more electrical components, one or more instructions (e.g., encoded in storage media), and/or one or more processors, and the like.

The term "semiconductor die" as used herein refers to both the singular and plural form of the words, and accordingly can refer to both a single semiconductor device and multiple semiconductor devices.

The term "semiconductor substrate" detailed herein may include an organic package substrate, a coreless substrate, and a high-density build-up (HDBU) laminate substrate, and may be organic, or made of glass.

The term "interconnect" detailed herein may include a silicon bridge (Si-bridge), a glass bridge, a molded organic bridge with fine line/space structures used for die-to-die high bandwidth communications, and an embedded multi-die interconnect bridge (EMIB).

FIG. 1 shows a flow diagram of a method for real-time offset adjustment of a semiconductor die placement.

According to various embodiments, in step 102, operational parameters of a die mounting tool is obtained or received in real-time. The operational parameters may include die transfer features from wafer to the bond head and die/panel alignment features.

According to various embodiments, in step 104, an offset adjustment of the semiconductor die placement is predicted based on the operational parameters.

According to various embodiments, the operational parameters may include intrinsic errors of the die mounting tool. The die mounting tool measures the operational parameters which includes die transfer features from wafer to the bond head and die/panel alignment features. Each operational parameters are the result of die mounting process with such intrinsic errors. Intrinsic errors of mechanical parts of the die mounting tool prevents die attachment on a target location on top of a panel. To compensate such variations or errors, an offset adjusting die placement is added.

In various embodiments, the die mounting tool may include one or more mechanical parts configured for carrying the semiconductor die. The operational parameters may include intrinsic error of at least one of the mechanical parts.

According to various embodiments, the operational parameters may be inputted into an artificial intelligence module for estimating the offset adjustment. The estimation the offset adjustment of the semiconductor die placement may be done using at least one of imitation learning, and reinforcement learning.

According to various embodiments, in step 106, semiconductor die placement coordinates is determined based on an original die placement and the offset adjustment.

According to various embodiments, the semiconductor die placement is determined by subtracting the offset adjustment from the original die placement.

According to various embodiments, the die mounting tool may include a sensor for obtaining or receiving the operational parameters. The sensor may be an image sensor, such as an industrial-grade smart camera.

According to various embodiments, the operational parameters may be pre-processed before being inputted into the artificial intelligence module for estimating the offset adjustment. Pre-processing may enhance the quality of the operational parameters, which may lead to more accurate prediction of the offset adjustment.

According to various embodiments, the offset adjustment may be a set of coordinates including an x-axis coordinate, a y-axis coordinate and a die shift angle θ.

According to various embodiments, a semiconductor die may be loaded on the die mounting tool. When the offset adjustment is determined, the method may further include a step of proceeding with the placement of the semiconductor die on the panel based on the semiconductor die placement coordinates.

Figure 2:
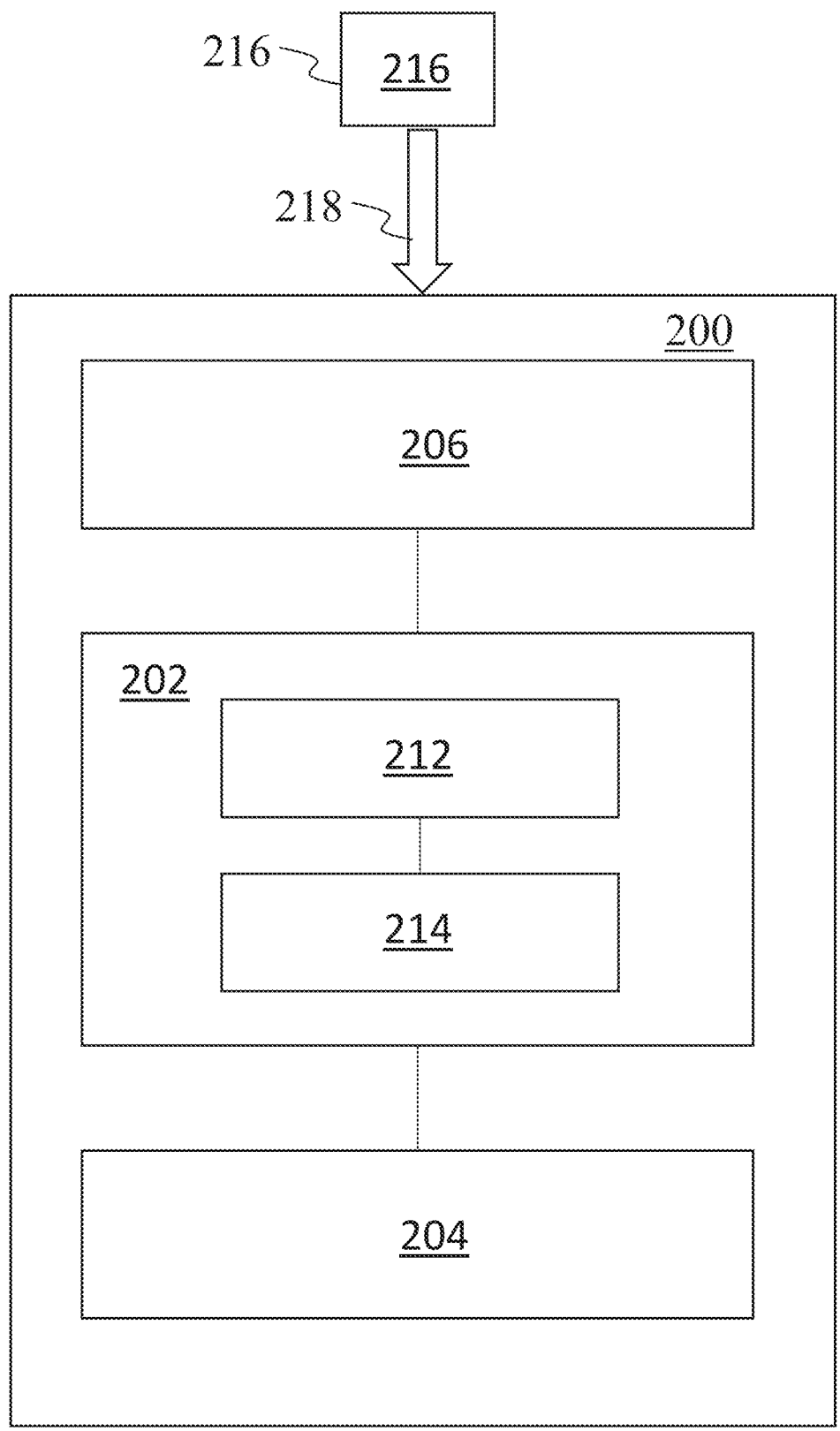
FIG. 2 shows a schematic block diagram of a device for real-time offset adjustment of a semiconductor die placement.

FIG. 2 shows a schematic block diagram of a device 200 for real-time offset adjustment of a semiconductor die placement.

In various embodiments, the device 200 may include one or more processor(s) 202; and a memory 204 having instructions stored therein, the instructions, when executed by the one or more processor(s) 202, cause the one or more processor(s) 202 to: obtain or receive operational parameters of a die mounting tool in real-time, wherein the die mounting tool is configured for placing the semiconductor die on a panel; predict an offset adjustment of the semiconductor die placement based on the operational parameters; and determine semiconductor die placement coordinates based on an original die placement and the offset adjustment.

In some aspects, the device 200 may include a communication interface 206 configured to interface with one or more input/output devices, for example, to receive operational parameters over interconnect 218 from sensor 216.

The device 200 may be suited for deployment in an industrial manufacturing process, for example, a semiconductor packaging process, and more specifically a semiconductor die bonding process.

In some aspects, the processor 202 may include a sensor module 212 and an artificial intelligence module 214. The sensor module 212 may be a machine vision module.

The sensor module 212 may be arranged in data communication with the sensor 216 which is configured to obtain one or more images operational parameters of the die bonding tool. The operational parameters may include intrinsic errors of the die mounting tool.

Figure 3:
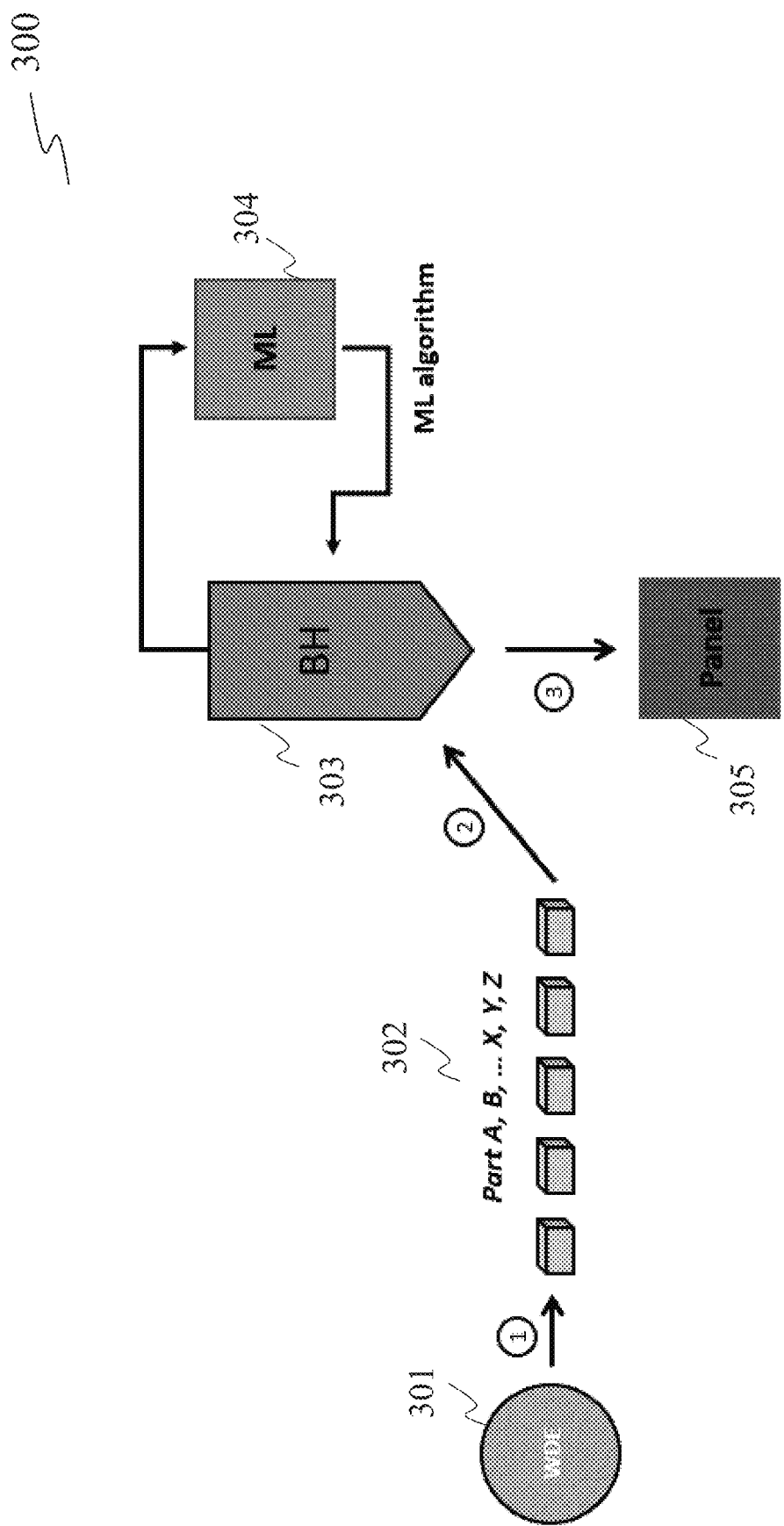
FIG. 3 is a flow diagram of a method for real-time offset adjustment of a semiconductor die placement.

FIG. 3 is a flow diagram of a method for real-time offset adjustment of a semiconductor die placement.

FIG. 3 shows a die attachment process with a die mounting tool 302. The die mounting tool 302 may include one or multiple mechanical parts (e.g., part A, B, X, Y, Z) that carry dies from a wafer die ejector (WDE) 301 to a bond head 303. The operational parameters, which includes die transfer features from wafer 301 to the bond head 303 and die/panel alignment features is measured. Each operational parameters are the result of die mounting process with such intrinsic errors. Intrinsic errors of mechanical parts of the die mounting tool 302 prevents die attachment on a target location on top of a panel 305. The operational parameters may be inputted into a machine learning algorithm 304 for estimating the offset adjustment. The offset adjustment of the semiconductor die placement may be done using at least one of imitation learning, and reinforcement learning. To compensate such variations or errors, an offset adjusting die placement is added.

Figure 4C:
FIG. 4A to 4C show results of various methods for offset adjustment of a semiconductor die placement.
Figure 4B:
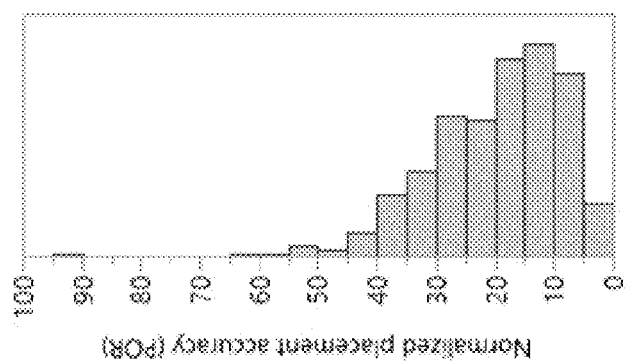
Figure 4A:
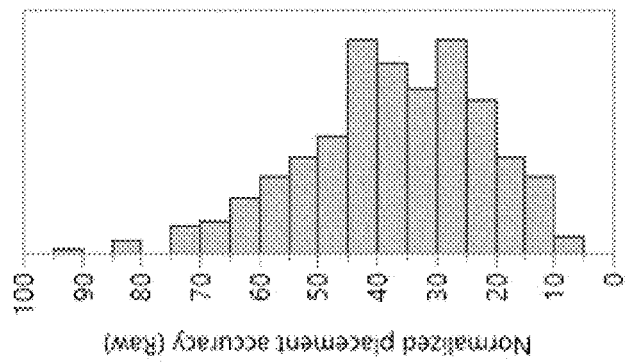

FIG. 4A to 4C show results of various methods for offset adjustment of a semiconductor die placement.

In FIG. 4A, the normalized die placement accuracy of raw data is shown.

In FIG. 4B, the normalized die placement accuracy of data adjusted with a previous known method of offset adjustment using average offsets is shown. The final die placement accuracy has been calculated by subtracting the averaged offset from the DMH die placement. Final die placement accuracy=DMH die placement-Averaged offset. The application of an averaged offset is not able to capture die-to-die variations.

FIG. 4B demonstrates the inaccuracy of a previous known method of offset adjustment using averaged offsets. As shown, the previous known method of offset adjustment using average offset results in a high variation of error, indicating inconsistent results, which will lead to unstable die placement accuracy.

In FIG. 4C, the normalized die placement accuracy of data adjusted with the machine learning offset is shown. The final die placement accuracy has been calculated by subtracting the machine learning (ML) offset from the DMH die placement. Final die placement accuracy=DMH die placement−ML adjusted offset. The result of this invention (i.e., machine learning module) is gives an offset that results the final die placement accuracy to be close to zero as possible, which may lead to a more consistent and stable die placement accuracy.

Figure 5A:
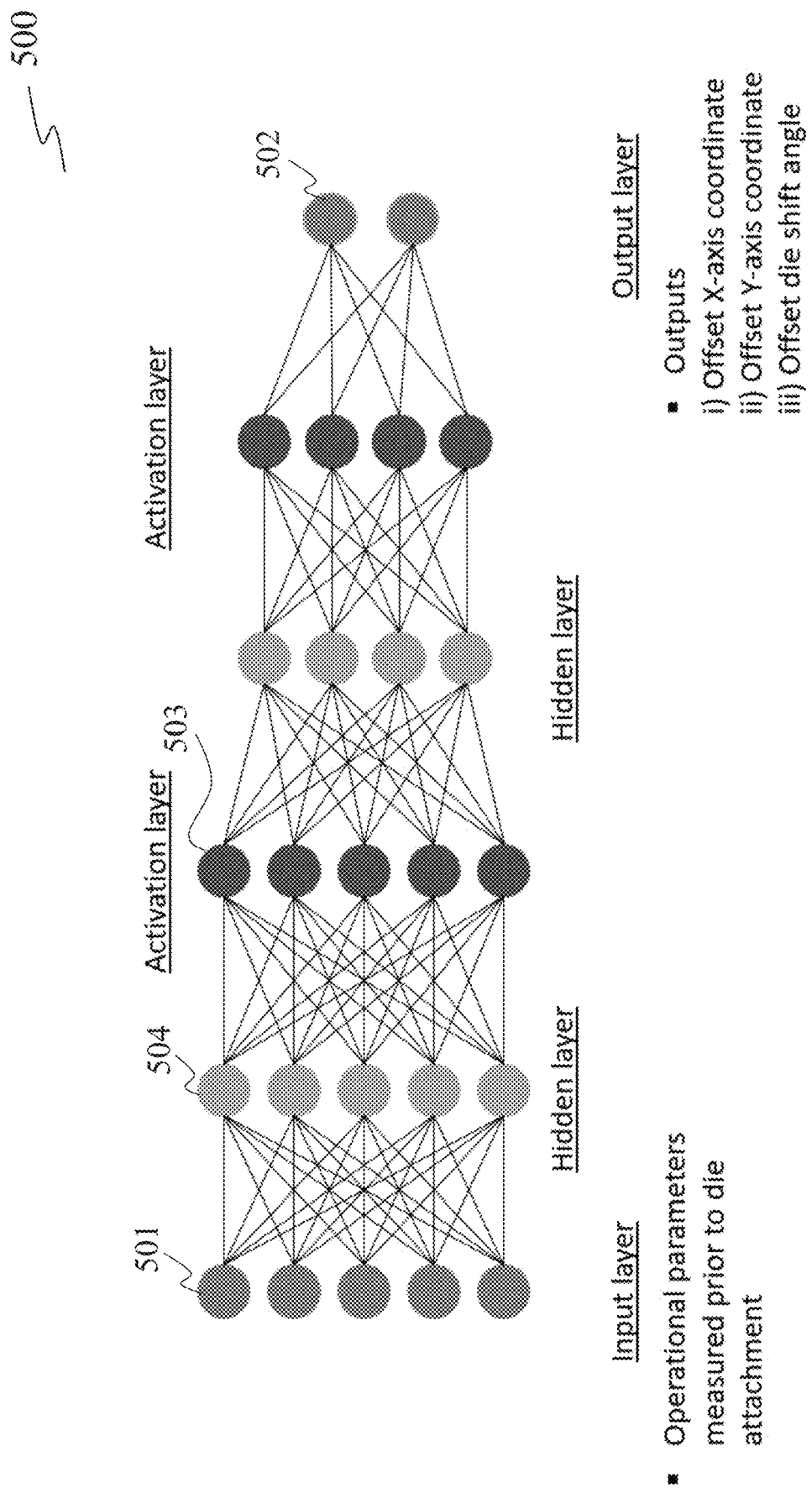
FIGS. 5A to 5B show various machine learning methods for real-time offset adjustment of a semiconductor die placement.
Figure 5B:
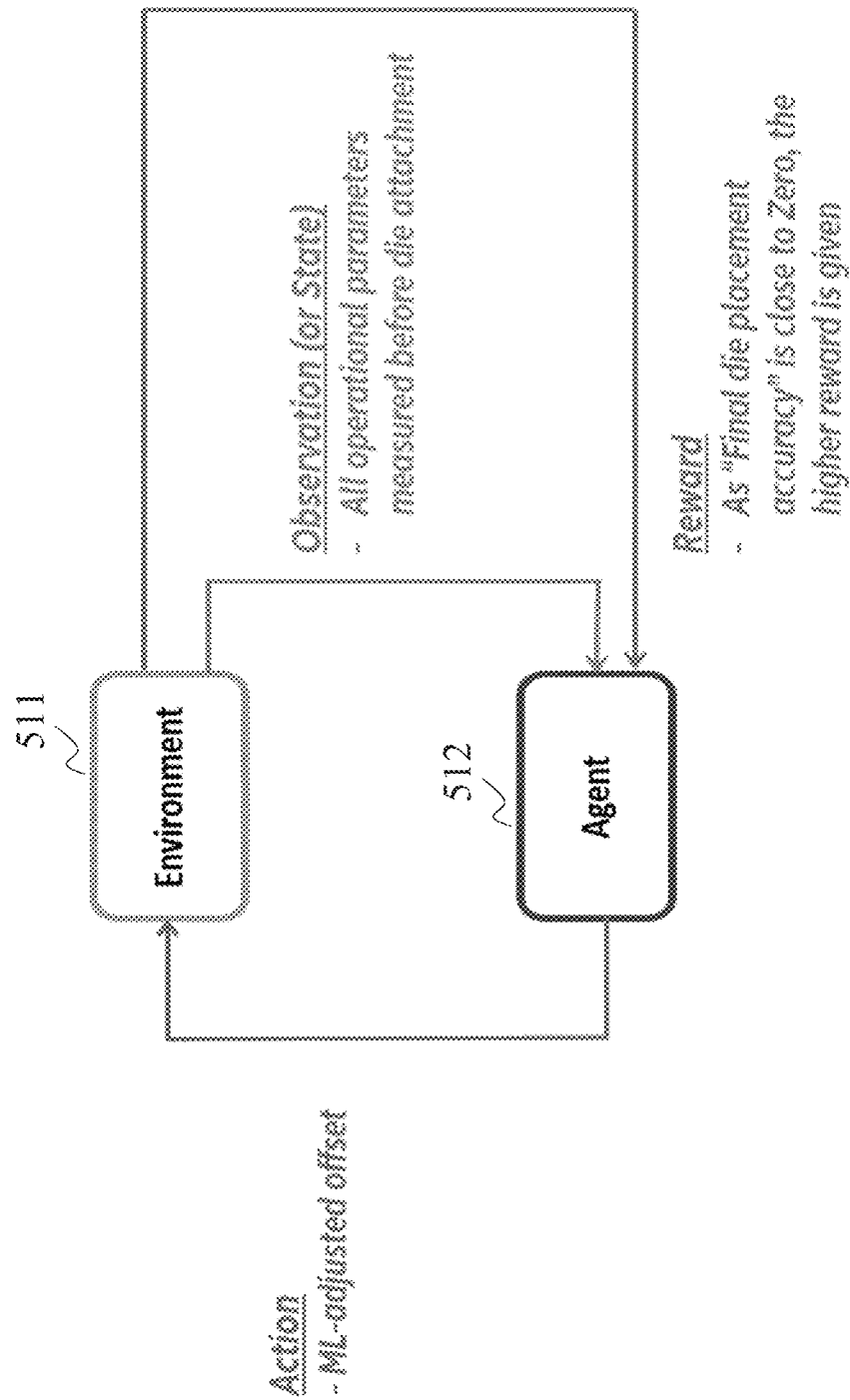

FIGS. 5A to 5B show various machine learning methods for real-time offset adjustment of a semiconductor die placement.

Various machine learning algorithms made be used to predict the offset adjustment. For example, but not limited to, imitation learning (FIG. 5A), and reinforcement learning (FIG. 5B). A key idea underlying those algorithms is to use operation parameters measured prior to die attachment as input parameters because intrinsic variations or errors of the mechanical parts in a tool are reflected into those parameters. With those input parameters, the algorithms result an offset that maximize the final die placement accuracy. Though input and output parameters are identical from algorithm to algorithm, each algorithm uses a different way to update the model. For instance, the imitation learning algorithm uses a supervised learning method to update a deep neural network by using a back-propagation while the reinforcement learning algorithm uses a reward function to update its prediction model.

FIG. 5A shows an example of deep neural network 500 used in an imitation learning algorithm to predict offset adjustment.

Inputs 501 are the operation parameters measured prior to die attachment. The outputs 502 are the predicted offset adjustments. The outputs are a set of coordinates in the x axis and y axis and a die shift angle θ. In between the inputs 501 and outputs 502 are activation layers 503 and hidden layers 504. There may be 2 activation layers 503 and 3 hidden layers 504.

FIG. 5B shows an example of reinforcement learning (RL) algorithm 510 including environment 511, agent 512, observation or state, action, and reward. The environment 511 correspond to the DMH tool and the agent 512 correspond to the RL algorithm. Operation parameters measured prior to die attachment are used as inputs (i.e., observation). The RL algorithm gives outputs (i.e., action). The results of the Action (i.e., reward) will be used for updating the RL algorithm.

The following examples pertain to further exemplary implementations.

Example 1 is a method for real-time offset adjustment of a semiconductor die placement including: obtaining or receiving operational parameters of a die mounting tool in real-time, wherein the die mounting tool is configured for placing the semiconductor die on a panel; predicting an offset adjustment of the semiconductor die placement based on the operational parameters; and determining semiconductor die placement coordinates based on an original die placement and the offset adjustment.

Example 2 may include the method of example 1 and/or any other example disclosed herein, in which the semiconductor die placement is determined by subtracting the offset adjustment from the original die placement.

Example 3 may include the method of example 1 and/or any other example disclosed herein, in which predicting the offset adjustment of the semiconductor die placement based on the operational parameters includes inputting the operational parameters into an artificial intelligence module for estimating the offset adjustment.

Example 4 may include the method of example 3 and/or any other example disclosed herein, in which the estimation the offset adjustment of the semiconductor die placement is done using at least one of imitation learning, and reinforcement learning.

Example 5 may include the method of example 1 and/or any other example disclosed herein, in which, the operational parameters include intrinsic errors of the die mounting tool. Example 6 may include the method of example 5 and/or any other example disclosed herein, in which, the die mounting tool includes one or more mechanical parts configured for carrying the semiconductor die, and wherein the operational parameters include intrinsic error of at least one of the mechanical parts.

Example 7 may include the method of example 1 and/or any other example disclosed herein, in which, the die mounting tool includes a sensor for obtaining or receiving the operational parameters.

Example 8 may include the method of example 1 and/or any other example disclosed herein, in which, the offset adjustment is a set of coordinates including an x-axis coordinate, a y-axis coordinate and a die shift angle θ.

Example 9 is a device for real-time offset adjustment of a semiconductor die placement including: one or more processor(s); and a memory having instructions stored therein, the instructions, when executed by the one or more processor(s), cause the one or more processor(s) to: obtain or receive operational parameters of a die mounting tool in real-time, wherein the die mounting tool is configured for placing the semiconductor die on a panel; predict an offset adjustment of the semiconductor die placement based on the operational parameters; and determine semiconductor die placement coordinates based on an original die placement and the offset adjustment.

Example 10 may include the device of example 9 and/or any other example disclosed herein, in which, the semiconductor die placement is determined by subtracting the offset adjustment from the original die placement.

Example 11 may include the device of example 9 and/or any other example disclosed herein, in which predicting the offset adjustment of the semiconductor die placement based on the operational parameters includes inputting the operational parameters into an artificial intelligence module for estimating the offset adjustment.

Example 12 may include the device of example 11 and/or any other example disclosed herein, in which the estimation the offset adjustment of the semiconductor die placement is done using at least one of imitation learning, and reinforcement learning. Example 13 may include the device of example 9 and/or any other example disclosed herein, in which the operational parameters include intrinsic errors of the die mounting tool.

Example 14 may include the device of example 13 and/or any other example disclosed herein, in which, the die mounting tool includes one or more mechanical parts configured for carrying the semiconductor die, and wherein the operational parameters include intrinsic error of at least one of the mechanical parts.

Example 15 may include the device of example 9 and/or any other example disclosed herein, in which the die mounting tool includes a sensor for obtaining or receiving the operational parameters.

Example 16 may include the device of example 9 and/or any other example disclosed herein, in which the offset adjustment is a set of coordinates including an x-axis coordinate, a y-axis coordinate and a die shift angle θ.

Example 17 is a method for placing a semiconductor die on a panel including: loading a semiconductor die on the die mounting tool; obtaining or receiving operational parameters of a die mounting tool in real-time, wherein the die mounting tool is configured for placing the semiconductor die on a panel; predicting an offset adjustment of the semiconductor die placement based on the operational parameters; and determining semiconductor die placement coordinates based on an original die placement and the offset adjustment.

Example 18 may include the method of example 17 and/or any other example disclosed herein, further including proceeding with the placement of the semiconductor die on the panel based on the semiconductor die placement coordinates.

Example 2 provides a non-transitory computer-readable medium including computer executable code that is configured, when executed, to cause one or more processors to: obtain or receive operational parameters of a die mounting tool in real-time, wherein the die mounting tool is configured for placing the semiconductor die on a panel; predict an offset adjustment of the semiconductor die placement based on the operational parameters; and determine semiconductor die placement coordinates based on an original die placement and the offset adjustment according to any one of examples disclosed herein.

Example 20 may include the non-transitory computer-readable medium of example 19 and/or any other example disclosed herein further configured to cause the one or more processors to determine the semiconductor die placement by subtracting the offset adjustment from the original die placement.

It should be noted that one or more of the features of any of the examples above may be combined with any one of the other examples.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. A method for real-time offset adjustment of a placement of a semiconductor die comprising:
   obtaining operational parameters of a die mounting tool in real-time, wherein the die mounting tool is configured for placing the semiconductor die on a panel,
   wherein the operational parameters comprise an intrinsic error associated with mechanical parts of the die mounting tool;
   predicting an offset adjustment of the semiconductor die placement based on the operational parameters;
   determining semiconductor die placement coordinates based on an original die placement, the offset adjustment, and a resulting prediction model for the intrinsic error as measured in real time by the die mounting tool; and
   placing the semiconductor die on the panel at the placement coordinates.

2. The method of claim 1, wherein the semiconductor die placement is determined by subtracting the offset adjustment from the original die placement.

3. The method of claim 1, wherein predicting the offset adjustment of the semiconductor die placement based on the operational parameters comprises inputting the operational parameters into an artificial intelligence module for estimating the offset adjustment.

4. The method of claim 3, wherein estimation the offset adjustment of the semiconductor die placement is done using at least one of imitation learning, and reinforcement learning.

5. The method of claim 1, wherein the die mounting tool comprises one or more mechanical parts configured for carrying the semiconductor die, and wherein the operational parameters comprise intrinsic error of at least one of the mechanical parts.

6. The method of claim 1, wherein the die mounting tool comprises a sensor for obtaining or receiving the operational parameters.

7. The method of claim 1, wherein the offset adjustment is a set of coordinates comprising an x-axis coordinate, a y-axis coordinate and a die shift angle θ.

8. A device for real-time offset adjustment of a semiconductor die placement comprising:
   one or more processor(s); and
   a memory having instructions stored therein, the instructions, when executed by the one or more processor(s), cause the one or more processor(s) to:
   obtain or receive operational parameters of a die mounting tool in real-time, wherein the die mounting tool is configured for placing the semiconductor die on a panel,
   wherein the operational parameters comprise an intrinsic error associated with mechanical parts of the die mounting tool;
   predict an offset adjustment of the semiconductor die placement based on the operational parameters; and
   determine semiconductor die placement coordinates based on an original die placement, the offset adjustment, and a resulting prediction model for the intrinsic error as measured in real time by the die mounting tool; and place the semiconductor die on the panel at the placement coordinates.

9. The device of claim 8, wherein the semiconductor die placement is determined by subtracting the offset adjustment from the original die placement.

10. The device of claim 8, wherein predicting the offset adjustment of the semiconductor die placement based on the operational parameters comprises inputting the operational parameters into an artificial intelligence module for estimating the offset adjustment.

11. The device of claim 10, wherein the estimation the offset adjustment of the semiconductor die placement is done using at least one of imitation learning, and reinforcement learning.

12. The device of claim 8, wherein the die mounting tool comprises one or more mechanical parts configured for carrying the semiconductor die.

13. The device of claim 8, wherein the die mounting tool comprises a sensor for obtaining or receiving the operational parameters.

14. The device of claim 8, wherein the offset adjustment is a set of coordinates comprising an x-axis coordinate, a y-axis coordinate and a die shift angle θ.

15. A method for placing a semiconductor die on a panel comprising:

loading a semiconductor die on a die mounting tool;

obtaining or receiving operational parameters of a die mounting tool in real-time, wherein the die mounting tool is configured for placing the semiconductor die on a panel, wherein the operational parameters comprise an intrinsic error associated with mechanical parts of the die mounting tool;

predicting an offset adjustment of a placement of the semiconductor die based on the operational parameters;

determining semiconductor die placement coordinates based on an original die placement, the offset adjustment, and a resulting prediction model for the intrinsic error as measured in real time by the die mounting tool; and placing the semiconductor die on the panel at the placement coordinates.

16. The method of claim 15, wherein the semiconductor die placement is determined by subtracting the offset adjustment from the original die placement.

17. The method of claim 15, wherein predicting the offset adjustment of the semiconductor die placement based on the operational parameters comprises inputting the operational parameters into an artificial intelligence module for estimating the offset adjustment.

* * * * *